United States Patent [19]

Hypes

[11] Patent Number: 5,080,611
[45] Date of Patent: Jan. 14, 1992

[54] BOARDLOCK FOR COMMON-HOLE DOUBLE-SIDED MOUNTING

[75] Inventor: Norman E. Hypes, Duluth, Ga.

[73] Assignee: AMP Incorporated, Harrisburg, Pa.

[21] Appl. No.: 632,451

[22] Filed: Dec. 21, 1990

[51] Int. Cl.$^5$ .............................................. H01R 13/73
[52] U.S. Cl. .................................... 439/567; 439/554
[58] Field of Search ............... 439/553, 554, 555, 562, 439/565, 567, 571

[56] References Cited

U.S. PATENT DOCUMENTS

| | | | |
|---|---|---|---|
| 4,173,387 | 11/1979 | Zell | 439/557 |
| 4,568,134 | 2/1986 | DiMondi | 439/680 |
| 4,681,389 | 7/1987 | Nakazawa et al. | 439/557 |
| 4,686,607 | 8/1987 | Johnson | 439/65 |
| 4,907,987 | 3/1990 | Douty et al. | 439/555 |
| 4,938,704 | 7/1990 | Fujiura | 439/95 |

FOREIGN PATENT DOCUMENTS

| | | |
|---|---|---|
| 8907847 | 10/1989 | Fed. Rep. of Germany . |
| 1-42645 | 12/1989 | Japan . |
| 3-2563 | 1/1991 | Japan . |

OTHER PUBLICATIONS

JAE Electronics, *SX Series Connector*, 2-1990, No. 101.

*Primary Examiner*—Gary F. Paumen

[57] ABSTRACT

An electrical connector assembly for mounting and securing first and second electrical connectors (120, 220) to a printed circuit board (24) having a boardlock receiving aperture (56) includes a first connector (120), a first connector boardlock (122), a second connector (220), and a second connector boardlock (222). The first connector (120) includes a dielectric housing (26) having a boardlock receiving recess (154) and a mounting face (30), said first connector (120) positioned on a first surface (146) of the board (24) with the recess (154) aligned with the aperture (56). A boardlock (122), disposed in the first connector housing recess (154), has a first portion (58) received and secured in the recess (154) and a second portion (68) received and secured in the boardlock receiving aperture (56). The second portion (68) of the boardlock (122) comprises a pair of springs (72, 74) defining an elongate slot (70) therebetween, the springs (72, 74) extending from the first portion (58) to an end (80) of the second portion (68) beyond the mounting face (30), the end (80) being open. The second connector (220) includes a dielectric housing (26) having a boardlock receiving recess (254) and a mounting face (30), said second connector (220) positioned on a second surface (246) of the board (24) with the recess (254) aligned with the aperture (56). A like boardlock (222), disposed in the second connector housing recess (254), has a first portion (58) received and secured in the recess (54) and a second portion (68) received and secured in the boardlock receiving aperture (56). The boardlock (222) of the second connector (220) is at an angle to the boardlock (122) of the first connector (120).

25 Claims, 4 Drawing Sheets

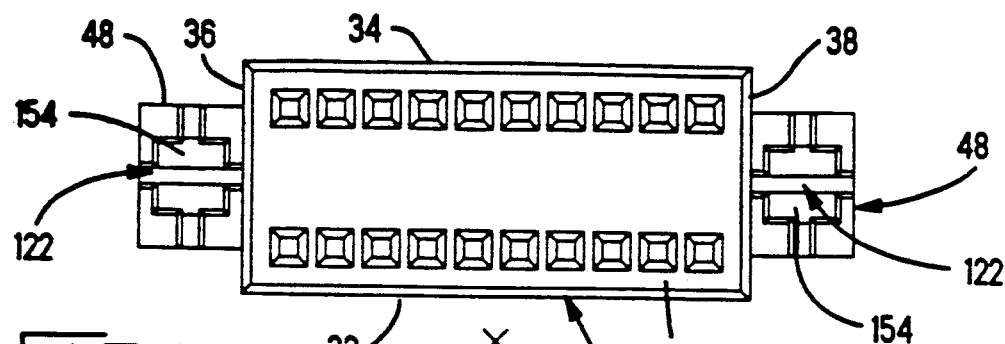
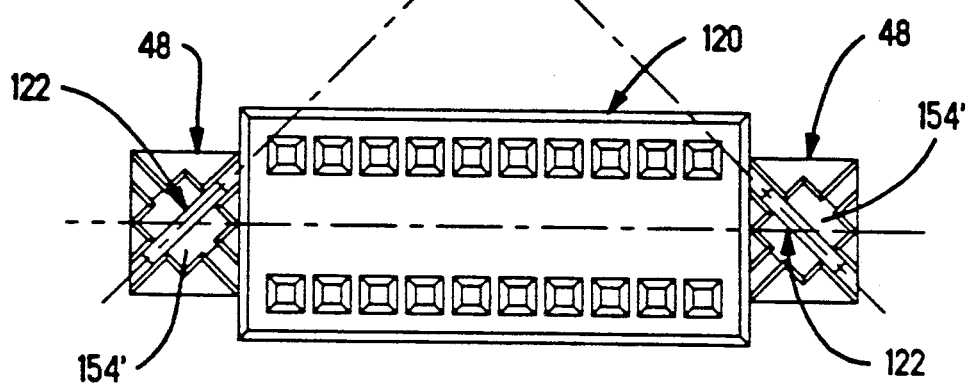
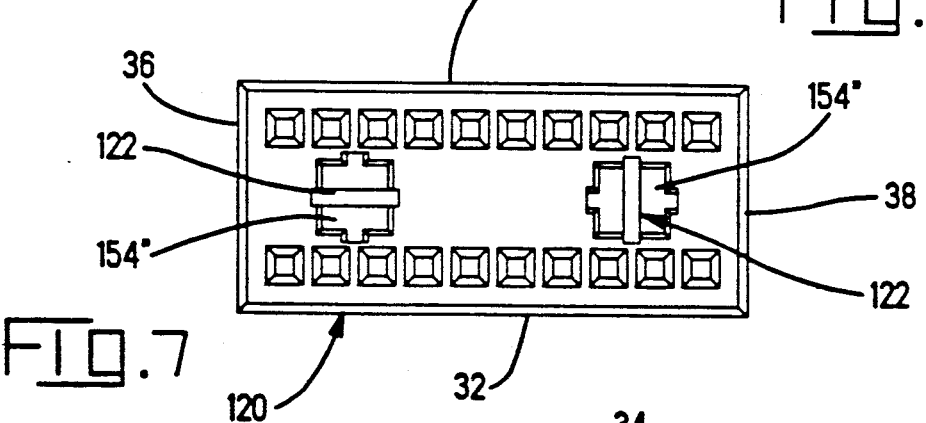
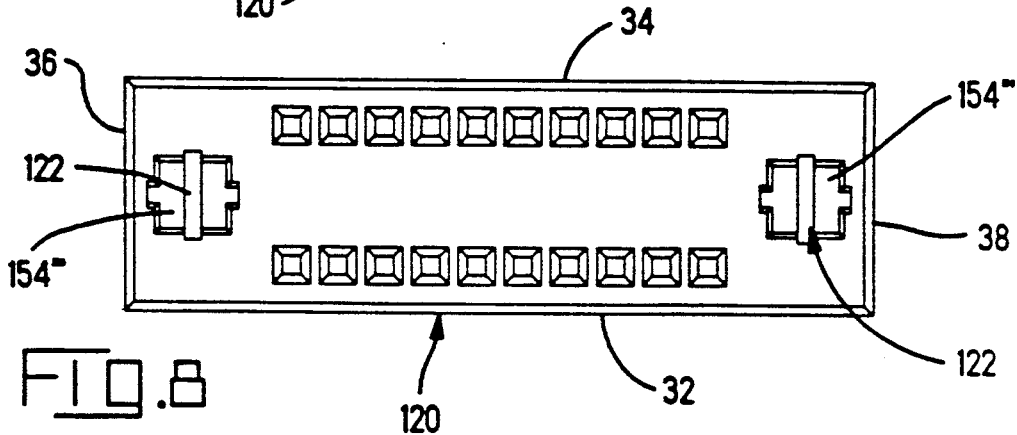

BOARDLOCK FOR COMMON-HOLE DOUBLE-SIDED MOUNTING

BACKGROUND OF THE INVENTION

The present invention relates to electrical connectors, and in particular to a means of securing two connectors to opposite sides of a printed circuit board.

Apparatus exists for providing electrical connectors with means for being secured to a printed circuit board. One such apparatus is disclosed in U.S. Pat. No. 4,907,987 in which a boardlock having barbs is closely received in an aperture in a printed circuit board. The connector includes a dielectric housing having an integral flange having a mounting face, an opposed holding face, and an aperture extending therebetween. A first portion of the boardlock is disposed and secured in the housing aperture. A second portion of the boardlock comprises spring means extending from the first portion to an end beyond the mounting face. The spring means have barb means thereon, positioned along the spring means between the first portion and the end. The barbs extend laterally from the spring means such that when the second portion of the boardlock is received in a boardlock receiving aperture in a printed circuit board, the barb means engage the wall of the boardlock receiving aperture to secure the connector to the printed circuit board.

With the known apparatus, one may mount connectors to opposite sides of a circuit board. However, the boardlocks can not share boardlock receiving apertures. This requires first that the board have one pair of apertures for each connector mounted on either side of the board. In addition, each connector must be offset from all connectors on the opposite side of the board. Connectors of opposite sides of the board being offset results in inefficient space utilization of the board. If connectors can share apertures, they may be mounted directly across the board from each other. This saves surface space on the board not only by freeing space otherwise used by the additional apertures, but also by not having to offset connectors on opposites of the board.

SUMMARY OF THE INVENTION

In accordance with the present invention, an electrical connector assembly for mounting and securing first and second electrical connectors to a printed circuit board having a boardlock receiving aperture includes a first connector, a first connector boardlock, a second connector, and a second connector boardlock. The first connector includes a dielectric housing having a boardlock receiving recess and a mounting face, said first connector positioned on a first side of the board with the recess aligned with the aperture. A boardlock, disposed in the first connector housing recess, has a first portion received and secured in the recess and a second portion received and secured in the boardlock receiving aperture. The second portion of the boardlock comprises a pair of springs defining an elongate slot therebetween, the springs extending from the first portion to an end of the second portion beyond the mounting face, the end being open. The second connector includes a dielectric housing having a boardlock receiving recess and a mounting face, said second connector positioned on a second side of the board with the recess aligned with the aperture. A like boardlock, disposed in the second connector housing recess, has a first portion received and secured in the recess and a second portion received and secured in the boardlock receiving aperture. The boardlock of the second connector is at an angle to the boardlock of the first connector.

BRIEF DESCRIPTION OF THE DRAWING

FIG. 5 is a top view of a connector mounted on a printed circuit board having the boardlocks aligned with the major axis of the connector;

FIG. 6 is a top view of a connector similar to that of FIG. 5, having the boardlocks aligned at an angle to the major axis of the connector;

FIG. 7 is a top view of a connector similar to that of FIG. 5, having the boardlocks located between rows of contacts; and FIG. 8 is a top view of a connector similar to that of FIG. 5, having the housing extending to the boardlock receiving apertures.

DESCRIPTION OF THE PREFERRED EMBODIMENT

Figure 1:
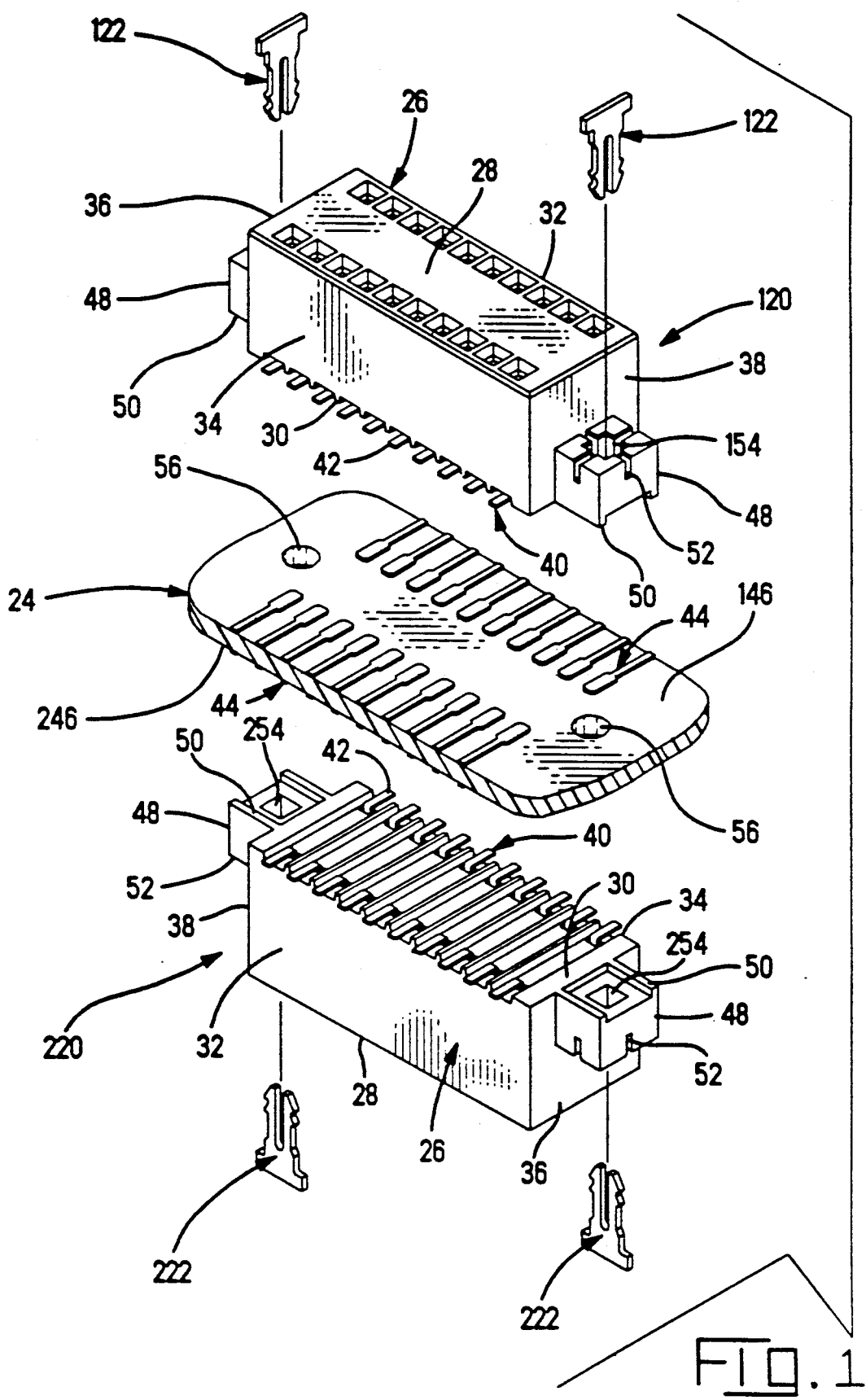
FIG. 1 is a perspective view of two electrical connectors, each including a boardlock, exploded from a cutaway printed circuit board, in accordance with the present invention.

FIG. 1 is a perspective view of two surface mount connectors 120, 220, including respectively boardlocks 122, 222 in accordance with the present invention, exploded from a printed circuit board 24. Each connector 120, 220 has a housing 26 molded of thermoplastic having a mating face 28, an opposed mounting face 30, opposed side walls 32, 34, and opposed end walls 36, 38.

Connectors 120, 220 have terminal receiving passages extending from mating face 28 to mounting face 30, with terminals 40 secured therein. Terminals 40 are typically for surface mount termination to interconnect the solder tail portion of terminals to traces on a surface of a printed circuit board. Terminals 40 may be any known terminal, including both pins or sockets, such as the terminals disclosed in U.S. Pat. Nos. 4,693,528 or 4,695,106, the disclosures of which are hereby incorporated by reference.

Connectors 120, 220 may each have a pair of mounting flanges 48 having mounting face 50, holding face 52, and a recess or aperture 154, 254 therein extending from mounting face 50 to holding face 52 for receiving boardlock 122, 222. The mounting faces 50 of flanges 48 are co-planar for reception against printed circuit board 24 and may have standoffs for cleaning under connectors 120, 220 after a soldering operation.

Figure 2:
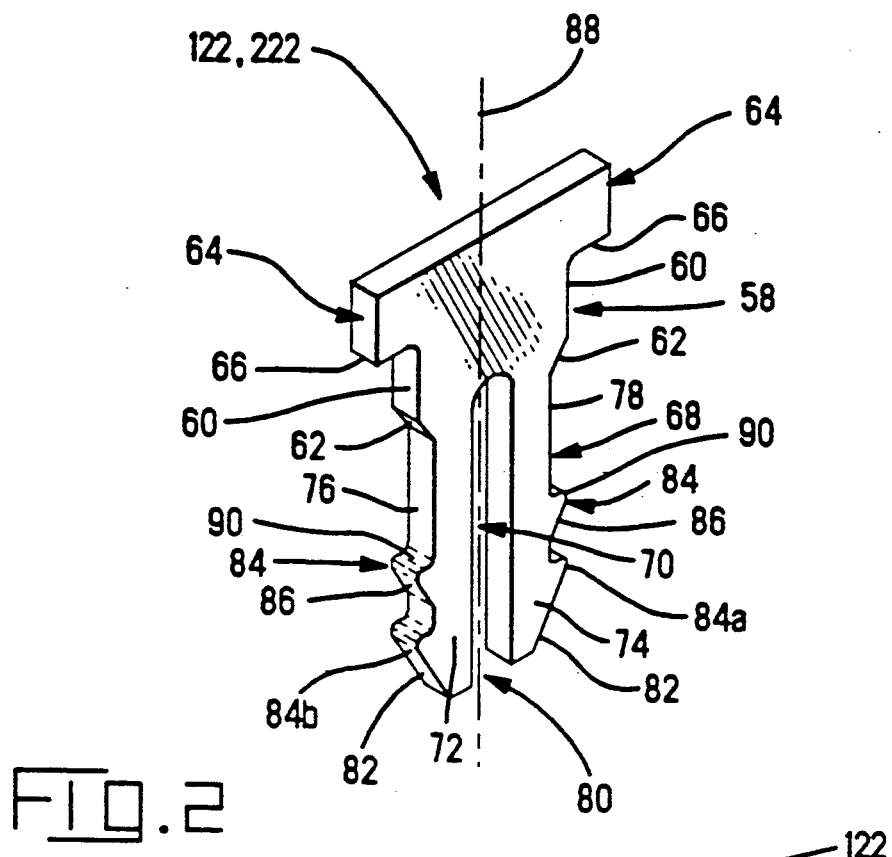
FIG. 2 is an enlarged perspective view of a single boardlock, as shown in FIG. 1.

As best seen in FIG. 2, planar boardlock 122, 222 is stamped from flat stock. While the boardlocks could be manufactured from other suitable material, heat treated steel is preferred. The boardlocks are then plated to enhance solder wetting. Boardlock 122, 222 has a first portion 58 adapted to be received in aperture 154, 254 in an interference fit. Typically the width of first portion 58 between sheared surfaces 60 is slightly larger than the width of aperture 154, 254 such that upon insertion of boardlock 122, 222 into aperture 154, 254, tapered edges 62 plow through the housing material peripheral to aperture 154, 254 providing an interference fit retention. Tabs 64 extend from first portion 58 and extend laterally beyond sheared surfaces 60 defining shoulders 66 that engage holding face 52 to secure connectors 120, 220 against surfaces 146, 246, respectively. Tabs 64 thus provide means for preventing housing 26 from being separated from boardlock 122, 222.

Figure 3:
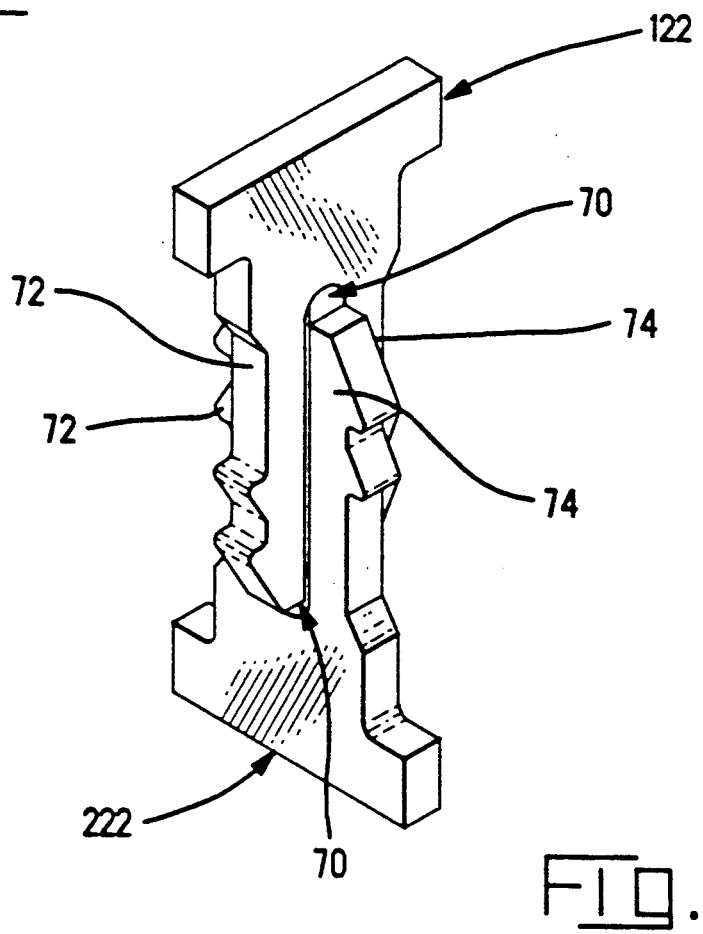
FIG. 3 is an enlarged perspective view of a pair of boardlocks in accordance with the present invention.

Second portion 68 extends from first portion 58 and has elongate slot 70 defining spring members 72, 74. The width of second portion 68 as defined by outer sheared surfaces 76, 78 is typically less than the width of first portion 58, as defined by surfaces 60, 62 and typically less than the width of boardlock receiving apertures 56 in printed circuit board 24. Spring members 72, 74 extend to open end 80 beyond mounting face 50. Open end 80 may have tapered surfaces 82 to facilitate insertion into aperture 154, 254 and boardlock receiving aperture 56. According to the invention, boardlocks 122, 222 cooperate as shown in FIG. 3. Springs 72, 74 of boardlock 122 are positioned on either face of planar boardlock 222, with elongate slot 70 of boardlock 122 intersected with elongate slot 70 of boardlock 222.

Along spring members 70, 72 on sheared surfaces 76, 78, boardlock 122, 222 has barbs 84 extending laterally beyond the width of second portion 68 as defined by surfaces 76, 78. Barbs 84 have a tapered surface 86 which is angled toward the centerline 88 of boardlock 122, 222 in the direction from first portion 58 to end 80; tapered surface 86 extends to tip 90. Typically barbs 84 are spaced in pairs laterally opposite each other such that a barb 84a on one spring member, 74, is laterally opposite a barb 84b on the other spring member, 72. The tips 90 of barbs 84a, 84b define a width that is greater than the width of boardlock receiving aperture 56.

Figure 4:
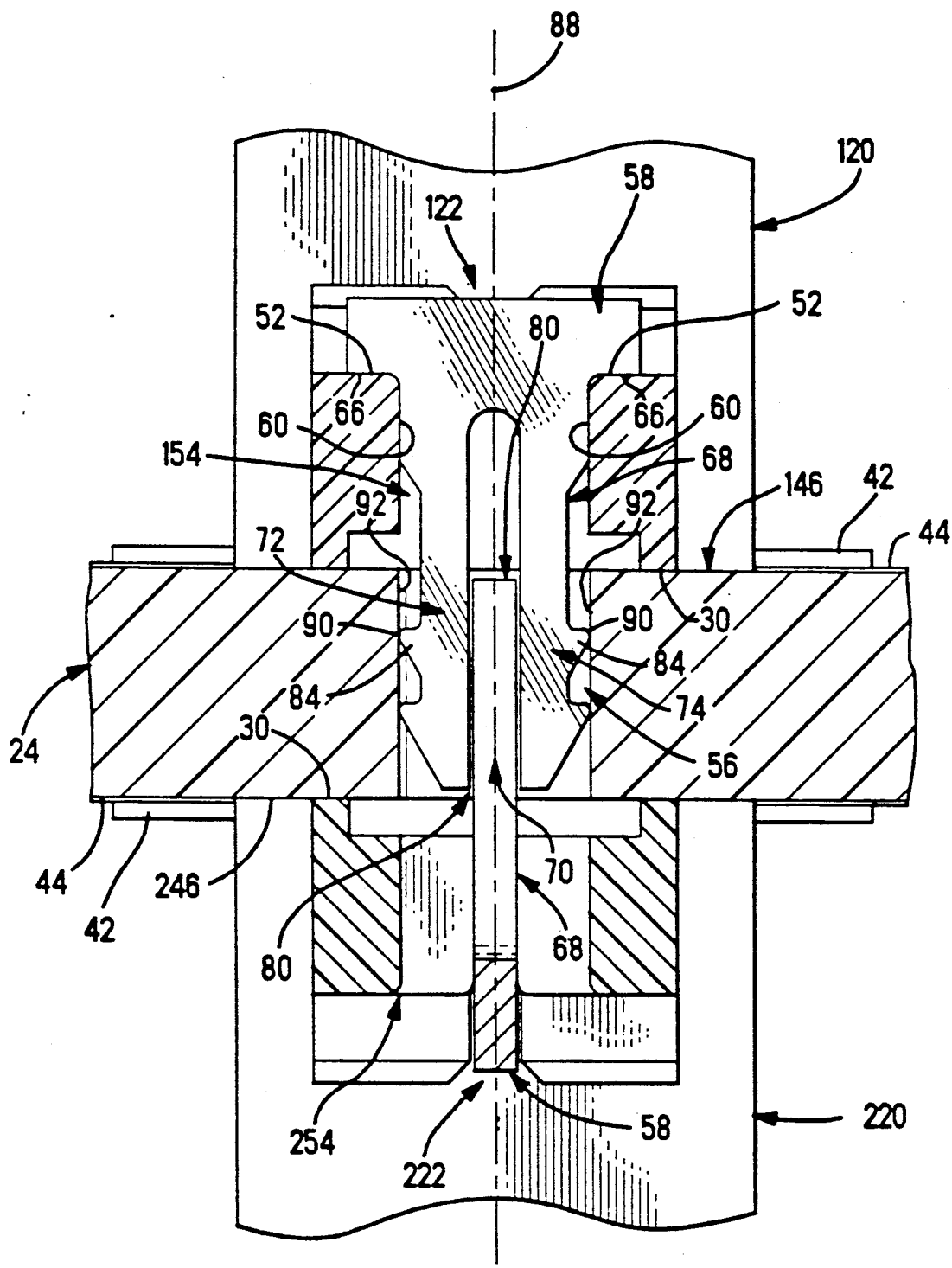
FIG. 4 is an end view, partly in section, of two connectors mounted on a printed circuit board, each connector having mounting flanges with boardlocks secured therein.

Barbs 84 are spaced along spring members 70, 72 in the region of elongated slot 70. As best seen in FIG. 4, barbs 84 are positioned to engage the wall 92 of boardlock receiving apertures 56 upon mounting connectors 120, 220 on printed circuit board 24.

Boardlock 122, 222 are inserted into boardlock receiving apertures 154, 254 of connectors 120, 220 until shoulders 66 engage holding face 52. The position of each boardlock 222 with respect to connector 220 is at a right angle to the position of corresponding boardlock 122 with respect to connector 220, although the invention would encompass any angle. Connectors 120, 220 are subsequently positioned on respective sides and spaced from printed circuit board 24, typically robotically, with centerline 88 of boardlocks 122, 222 and hence the axis of apertures 154, 254, aligned with the axis of aperture 56. While the preferred embodiment may include simultaneous mounting of two connectors, it is contemplated that only a single connector 120 may also be mounted at one time, and the second connector 220 may be added subsequently. Connectors 120, 220 are then moved toward printed circuit board 24 until second portion 68 of each boardlock 122, 222 is received in boardlock receiving aperture 56 facilitated by tapered surfaces 82. As connectors 120, 220 are moved closer to printed circuit board 24, barbs 84 begin to enter aperture 56. A reaction, due to the relative motion of the connector toward printed circuit board 24, at the periphery of aperture 56, causes inward deflection of spring members 72, 74 as tapered surfaces 86 ride up the periphery of aperture 56 at first surface 146. Barbs 84 enter aperture 56 with barbs 84, and specifically tips 90, biting into wall 92. An insertion force is thus required to cause boardlock 122, 222 to pass into boardlock receiving aperture 56. As second portions 68 continue to pass into aperture 56, open ends 80 of boardlocks 122, 222 approach each other. Boardlocks 122, 222, having previously been positioned at an angle, interlace at open ends 80, with springs 72, 74 forming a cross. The movement of connector 120 toward first surface 146, and connector 220 toward second surface 246, continues until mounting face 30 of connector 120 engages first surface 146, and mounting face 30 of connector 220 engages second surface 246. In this manner, barbs engage wall 92 in an interference fit, typically half way through the thickness of the printed circuit board, to secure boardlocks 122, 222 and hence connectors 120, 220 to printed circuit board 24 as shown in FIG. 4. Boardlock 122, 222 is preferably backed by tooling during insertion into aperture 56 to assure that boardlock 122, 222 does not back out of aperture 154, 254.

FIGS. 1 and 4 show boardlocks 122 received, or positioned to be received, in aperture 154 such that the plane of boardlock 122 is perpendicular to the length of connector 120 and the plane of boardlock 222 is parallel to the length of connector 220. FIG. 1 further shows two boardlocks 122, the planes of which are parallel, and two boardlocks 222, the planes of which are parallel. The plane of the boardlocks is not required to be perpendicular to the length of the connector 120 or parallel to each other when two or more boardlocks are present. FIG. 5 shows a connector having two boardlocks 122 wherein the plane of the boardlocks is parallel to a plane passing through the axes of apertures 154. However, the plane of each boardlock 222 must be at an angle to the plane of its corresponding boardlock 122.

Since boardlocks 122, 222 are planar, errors in positioning connectors 120, 220 and thus the solder tail portion 42 of terminals 40 relative to traces 44 can be significant. Position errors can be reduced by orienting the plane of boardlocks 122 to be perpendicular to each other. Position errors can be minimized by further orienting the plane of each boardlock 122 in connector 120 to a 45° angle with respect to a line segment drawn through the axis of apertures 154' in which boardlocks 122 are secured in connector 120, as is shown in FIG. 6.

As best seen in FIG. 7, boardlocks 122 and apertures 154'' may be placed between terminals 40 thereby obviating the need for flanges 48. The plane of boardlock 122 may be parallel to a row of terminals 40 or perpendicular thereto.

As best seen in FIG. 8, boardlocks 122 and apertures 154''' may be placed within the housing 26, similar to FIG. 7, thereby obviating the need for flanges 48. The housing 26 is enlarged to accommodate placement of the boardlocks 122 within the housing 26 and aligned with the boardlock receiving apertures 154 of FIG. 5. The plane of boardlock 122 may be parallel to a plane passing through the axis of apertures 154''' or perpendicular thereto.

Boardlocks 122, 222 may be any known boardlock, such as the boardlocks disclosed in U.S. Pat. No. 4,907,987, the disclosure of which is hereby incorporated by reference. However, the boardlocks of each pair must be adapted to cooperate, including having an open end and an elongate slot as described. The preferred embodiment of boardlocks is as discussed above. Alternate embodiments, such as semi-cylindrical boardlocks, are contemplated within the scope of the invention.

Each of the boardlocks described herein may be retained in a connector housing in any known manner, including the interference fit described. Each boardlock obviates the need for active under-board tooling and will accommodate a wide range of tolerances in both printed circuit board thickness and boardlock receiving aperture diameter, as well as different thickness of printed circuit boards.

The boardlocks described herein may be used with any known connector, including surface mount as described. Use of surface mount connectors is preferred, for example to through hole connectors, since surface mounting requires no under-board tooling or posts which might interfere with a connector on the opposite surface of the board.

It is envisioned that the pair of connectors used may comprise one plug and one receptacle, two plugs, or two receptacles. However, the preferred embodiment is one plug and one receptacle.

I claim:

1. An electrical connector assembly for mounting and securing first and second electrical connectors to a printed circuit board having a boardlock receiving aperture, said assembly comprising:
   a first connector including a dielectric housing having a boardlock receiving recess and a mounting face, said first connector positioned on a first surface of the board with the recess aligned with the aperture;
   a boardlock disposed in the first connector housing recess, the boardlock having a first portion received and secured in the recess, the boardlock further having a second portion adapted to be received and secured in the boardlock receiving aperture, said second portion comprising a pair of springs defining an elongate slot therebetween, the springs extending from the first portion to an end of the second portion beyond the mounting face, the second portion further having an opening at the end;
   a second connector including a dielectric housing having a boardlock receiving recess and a mounting face, said second connector positioned on a second surface of the board with the recess aligned with the aperture;
   a like boardlock disposed in the second connector housing recess and adapted to be received and secured in the aperture with the slot of the boardlock of the second connector intersecting the slot of the boardlock of the first connector, said boardlock of the second connector being at an angle to the boardlock of the first connector.

2. An electrical connector assembly as recited in claim 1 further comprising:
   a second boardlock receiving aperture in the board;
   a second boardlock receiving recess in the first connector, said recess aligned with the second aperture;
   a like second boardlock disposed in the second recess of the first connector and extending into the second aperture;
   a second boardlock receiving recess in the second connector, said recess aligned with the second aperture;
   a like second boardlock disposed in the second recess of the second connector, said boardlock extending into the second aperture at an angle to the second boardlock of the first connector.

3. An electrical connector assembly as recited in claim 2, wherein the second boardlock of the first connector is substantially parallel to the first boardlock of the first connector.

4. An electrical connector assembly as recited in claim 3, wherein the boardlocks of the first connector are substantially parallel to a line segment drawn through the axis of the recesses of the first connector.

5. An electrical connector assembly as recited in claim 3, wherein the boardlocks of the first connector are substantially perpendicular to a line segment drawn through the axis of the recesses of the first connector.

6. An electrical connector assembly as recited in claim 3, wherein the boardlocks of the first connector are substantially at a 45° angle to a line segment drawn through the axis of the recesses of the first connector.

7. An electrical connector assembly as recited in claim 2, wherein the second boardlock of the first connector is substantially perpendicular to the first boardlock of the first connector.

8. An electrical connector assembly as recited in claim 7, wherein the second boardlock of the first connector is substantially parallel to a line segment drawn through the axis of the recesses of the first connector.

9. An electrical connector assembly as recited in claim 7, wherein the boardlocks of the first connector are substantially at a 45° angle to a line segment drawn through the axis of the recesses of the first connector.

10. An electrical connector assembly as recited in claim 1, wherein the boardlock receiving recess is a lateral channel in the housing.

11. An electrical connector assembly as recited in claim 10, wherein the housing further has a mating face opposed to the mounting face, and the lateral channel extends between the mounting face and the mating face.

12. An electrical connector assembly as recited in claim 1, wherein each spring further has barb means thereon positioned along the spring between the first portion and the end to engage wall means of the boardlock receiving aperture.

13. An electrical connector assembly as recited in claim 1, wherein the boardlock of each connector is substantially flat.

14. An electrical connector assembly as recited in claim 1, wherein the boardlock of the second connector is identical to the boardlock of the first connector.

15. An electrical connector assembly as recited in claim 1, wherein the springs of the boardlock of the first connector contact an inner surace of the boardlock receiving aperture and the springs of the boardlock of the second connector contact an inner surface of the boardlock receiving aperture.

16. An electrical connector assembly for mounting and securing first and second electrical connectors to a printed circuit board having a boardlock receiving aperture, said assembly comprising:
   a first connector including a dielectric housing having a boardlock receiving recess and a mounting face, said first connector positioned on a first surface of the board with the recess aligned with the aperture;
   a boardlock disposed in the first connector housing recess, the boardlock having a first portion received and secured in the recess, the boardlock further having a second portion adapted to be received and secured in the boardlock receiving aperture, said second portion comprising a pair of springs defining an elongate slot therebetween, the springs extending from the first portion to an end of the second portion beyond the mounting face, the second portion further having an opening at the end;

a second connector including a dielectric housing having a boardlock receiving recess and a mounting face, said second connector positioned on a second surface of the board with the recess aligned with the aperture;

a like boardlock disposed in the second connector housing recess and adapted to be received and secured in the aperture, said boardlock of the second connector being at an angle to the boardlock of the first connector, wherein the boardlock of the second connector is at a right angle to the boardlock of the first connector.

17. An electrical connector assembly for mounting and securing first and second electrical connectors to a printed circuit board having a boardlock receiving aperture, said assembly comprising:

a first connector including a dielectric housing having a boardlock receiving recess and a mounting face, said first connector positioned on a first surface of the board with the recess aligned with the aperture;

a boardlock disposed in the first connector housing recess, the boardlock having a first portion received and secured in the recess, the boardlock further having a second portion adapted to be received and secured in the boardlock receiving aperture, said second portion comprising a pair of springs defining an elongate slot therebetween, the springs extending from the first portion to an end of the second portion beyond the mounting face, the second portion further having an opening at the end;

a second connector including a dielectric housing having a boardlock receiving recess and a mounting face, said second connector positioned on a second surface of the board with the recess aligned with the aperture;

a like boardlock disposed in the second connector housing recess and adapted to be received and secured in the aperture, said boardlock of the second connector being at an angle to the boardlock of the first connector, wherein the boardlocks of both connectors extend substantially through the thickness of the board.

18. An electrical connector assembly for mounting and securing first and second electrical connectors to a printed circuit board having a boardlock receiving aperture, said assembly comprising:

a first connector including a dielectric housing having a boardlock receiving recess and a mounting face, said first connector positioned on a first surface of the board with the recess aligned with the aperture;

a boardlock disposed in the first connector housing recess, the boardlock having a first portion received and secured in the recess, the boardlock further having a second portion adapted to be received and secured in the boardlock receiving aperture, said second portion comprising a pair of springs defining an elongate slot therebetween, the springs extending from the first portion to an end of the second portion beyond the mounting face, the second portion further having an opening at the end;

a second connector including a dielectric housing having a boardlock receiving recess and a mounting face, said second connector positioned on a second surface of the board with the recess aligned with the aperture;

a like boardlock disposed in the second connector housing recess and adapted to be received and secured in the aperture, said boardlock of the second connector being at an angle to the boardlock of the first connector, each connector further comprising an integral flange, the boardlock receiving recess being in the flange.

19. An electrical connector assembly as recited in claim 18, wherein each integral flange further has a holding face opposed to the mounting face, and the recess is an aperture that extends between the mounting face and the holding face.

20. An electrical connector assembly as recited in claim 18, wherein the boardlock receiving recess is a lateral channel extending into the flange from a side thereof.

21. An electrical connector assembly for mounting and securing first and second electrical connectors to a printed circuit board having a boardlock receiving aperture, said assembly comprising:

a first connector including a dielectric housing having a boardlock receiving recess and a mounting face, said first connector positioned on a first surface of the board with the recess aligned with the aperture;

a boardlock disposed in the first connector housing recess, the boardlock having a first portion received and secured in the recess, the boardlock further having a second portion adapted to be received and secured in the boardlock receiving aperture, said second portion comprising a pair of springs defining an elongate slot therebetween, the spring extending from the first portion to an end of the second portion beyond the mounting face, the second portion further having an opening at the end;

a second connector including a dielectric housing having a boardlock receiving recess and a mounting face, said second connector positioned on a second surface of the board with the recess aligned with the aperture;

a like boardlock disposed in the second connector housing recess and adapted to be received and secured in the aperture, said boardlock of the second connector being at an angle to the boardlock of the first connector, wherein the second connector boardlock second portion springs are interlaced with the springs of the second portion of the boardlock of the first connector.

22. A method for securing first and second electrical connectors, each connector having a boardlock with a pair of legs defining an elongate slot therebetween, to opposite surfaces of a printed circuit board using a common boardlock receiving aperture, said method comprising the steps of:

positioning the first connector on a first surface of the board with the boardlock of the first connector received in the boardlock receiving aperture; and positioning the second connector on a second surface of the board with the boardlock of the second connector received in the boardlock receiving aperture with the legs of the boardlock of the second connector interlaced with the legs of the boardlock of the first connector about the slots.

23. A method as described in claim 22 wherein the printed circuit board has a second boardlock receiving aperture and each connector has a second like boardlock, said method further comprising the steps of:
inserting the second boardlock of the first connector into the second boardlock receiving aperture; and
inserting the second boardlock of the second connector into the second boardlock receiving aperture.

24. A method as recited in claim 22, prior to the step of positioning the first connector on the board, further comprising the step of:
disposing the boardlock of the first connector in a boardlock receiving recess of the first connector; and,
prior to the step of positioning the second connector on the board, further comprising the step of:
disposing the boardlock of the second connector in a boardlock receiving recess of the second connector.

25. A method as recited in claim 22, wherein the boardlock of the first connector is positioned in contact with an inner surface of the aperture, and the boardlock of the second connector is positioned in contact with an inner surface of the aperture.

* * * * *